United States Patent
Ju

(10) Patent No.: US 6,814,586 B1
(45) Date of Patent: Nov. 9, 2004

(54) ELECTRIC CONNECTOR

(76) Inventor: Ted Ju, No. 15, Wu Shiunn St., An Leh District, Keelung (TW)

( * ) Notice: Subject to any disclaimer, the term of this patent is extended or adjusted under 35 U.S.C. 154(b) by 0 days.

(21) Appl. No.: 10/426,716

(22) Filed: May 1, 2003

(51) Int. Cl.$^7$ ................................................ H01R 12/00
(52) U.S. Cl. .......................................... 439/66; 439/515
(58) Field of Search ............................ 439/66, 71, 591, 439/74, 91, 515, 83

(56) References Cited

U.S. PATENT DOCUMENTS

| | | | | |
|---|---|---|---|---|
| 4,268,102 A | * | 5/1981 | Grabbe ........................ | 439/331 |
| 4,334,727 A | * | 6/1982 | Scheingold et al. .......... | 439/71 |
| 4,354,729 A | * | 10/1982 | Grabbe et al. ............ | 439/733.1 |
| 4,511,197 A | * | 4/1985 | Grabbe et al. ................ | 439/69 |
| 4,906,194 A | * | 3/1990 | Grabbe ........................ | 439/71 |
| 4,927,369 A | * | 5/1990 | Grabbe et al. ................ | 439/66 |
| 4,959,029 A | * | 9/1990 | Grabbe ........................ | 439/862 |
| 5,092,783 A | * | 3/1992 | Suarez et al. ................ | 439/71 |
| 5,152,694 A | * | 10/1992 | Bargain ........................ | 439/66 |
| 5,177,671 A | * | 1/1993 | Atoh ............................ | 361/728 |
| 5,437,556 A | * | 8/1995 | Bargain et al. ................ | 439/66 |
| 5,573,435 A | * | 11/1996 | Grabbe et al. ............... | 439/862 |
| 5,762,505 A | * | 6/1998 | Lin .............................. | 439/83 |
| 5,820,389 A | * | 10/1998 | Hashiguchi .................. | 439/66 |
| 5,984,693 A | * | 11/1999 | McHugh et al. .............. | 439/66 |
| 6,227,869 B1 | * | 5/2001 | Lin et al. ...................... | 439/66 |
| 6,257,899 B1 | * | 7/2001 | Walkup ....................... | 439/66 |
| 6,276,941 B1 | * | 8/2001 | Wu .............................. | 439/66 |
| 6,280,254 B1 | * | 8/2001 | Wu et al. ..................... | 439/630 |
| 6,290,507 B1 | * | 9/2001 | Neidich et al. ............... | 439/66 |
| 6,293,805 B1 | * | 9/2001 | Wu .............................. | 439/66 |
| 6,293,806 B1 | * | 9/2001 | Yu ............................... | 439/66 |
| 6,296,495 B1 | * | 10/2001 | Wang et al. .................. | 439/71 |
| 6,447,304 B1 | * | 9/2002 | Korsunsky et al. .......... | 439/66 |
| 6,561,819 B1 | * | 5/2003 | Huang et al. ................. | 439/66 |
| 6,579,104 B1 | * | 6/2003 | Bishop et al. ................ | 439/66 |

* cited by examiner

Primary Examiner—Ross Gushi
(74) Attorney, Agent, or Firm—Varndell & Varndell, PLLC

(57) ABSTRACT

An electric connector is disclosed to include an electrically insulative housing, and a plurality of terminals respectively mounted in respective terminal grooves in a tilted position, each terminal having a base for bonding to a circuit board, a support arm upwardly extended from one end of the base, and a contact arm upwardly extended from the other end of the base and supported on the support arm for contacting a chip module at the top.

1 Claim, 5 Drawing Sheets

ELECTRIC CONNECTOR

BACKGROUND OF THE INVENTION (a) Field of the Invention

The present invention relates to electric connectors and, more particularly, to such an electric connector in which the terminals are obliquely arranged in parallel and compressible.

(b) Description of the Prior Art:

Electric connectors for connecting a chip module to a circuit board include two types. FIG. 1 shows an electric connector according to the first type. FIG. 2 shows an electric connector according to the second type. The electric connector of the first type, as shown in FIG. 1, comprises an electrically insulative housing 1 and a plurality of terminals 2 mounted in the housing 1. Each terminal 2 has a bottom side provided with a solder ball 3 for bonding to a circuit board 4, and a top end terminating in a contact portion 5 for contacting a chip module 6. This design of electric connector has numerous drawbacks. The contact area between the contact portion 5 and the chip module 6 is tiny, and a false contact may occur easily. The contact portion 5 may be permanently deformed after bent through a number of times, resulting in a contact problem. Further, in order to prevent contact between terminals, the terminals must be spaced from one another at a certain distance. Due to this reason, the size electric connector cannot be greatly reduced. The terminal 7 for an electric connector of the second type, as shown in FIG. 2, is an angled terminal having a smoothly arched contact portion 8 at the top. This design of electric connector ensures positive contact with the chip module. However, it has high impedance. Further, the terminal 7 tends to be deformed permanently after a long use. In order to reinforce the structural strength, the size of the terminal cannot be greatly reduced as desired.

SUMMARY OF THE INVENTION

The present invention has been accomplished under the circumstances in view. It is therefore the main object of the present invention to provide an electric connector, which has low impedance. It is another object of the present invention to provide an electric connector, which ensures positive contact with a chip module. It is still another object of the present invention to provide an electric connector, which fits the concept of small-size design. To achieve these and other objects of the present invention, the electric connector comprises an electrically insulative housing having a plurality of terminal grooves, and a plurality of terminals respectively mounted in the terminal grooves. Each terminal comprises a base, a support arm upwardly extended from a first end of the base, and a contact arm upwardly extended from a second end of the base and protruding over a top side of the corresponding terminal groove. The support arm supports the contact arm in positive contact with the loaded chip module without producing much impedance.

DETAILED DESCRIPTION OF THE PREFERRED EMBODIMENTS

Figure 1:
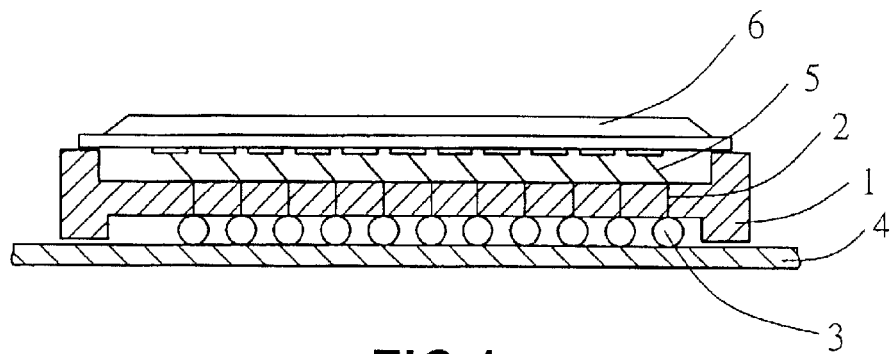
FIG. 1 is a sectional view showing a prior art electric connector connected between a chip module and a circuit board.
Figure 2:
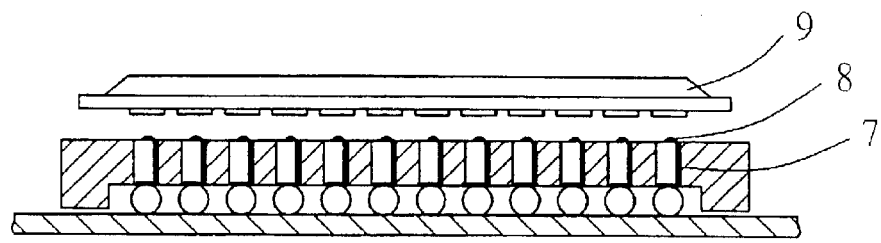
FIG. 2 is a sectional view showing another design of prior art electric connector for connection between a chip module and a circuit board.
Figure 3:
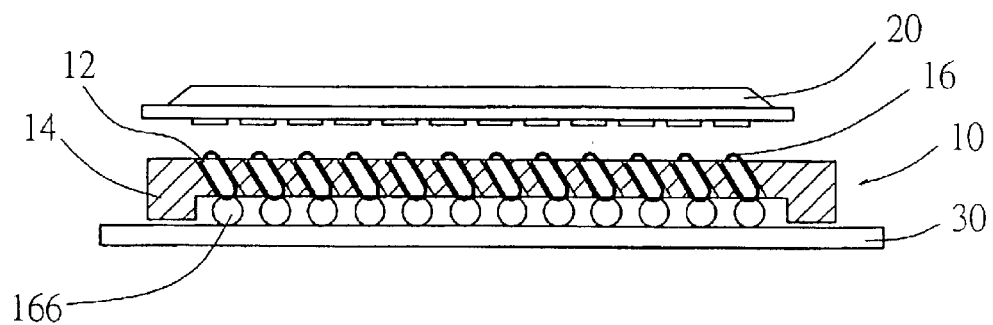
FIG. 3 is a sectional view showing an electric connector for connection between a chip module and a circuit board according to the first embodiment of the present invention.
Figure 4:
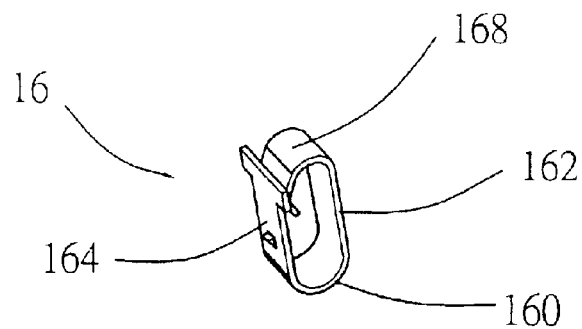
FIG. 4 is an elevational view of a terminal for an electric connector according to the first embodiment of the present invention.
Figure 5:
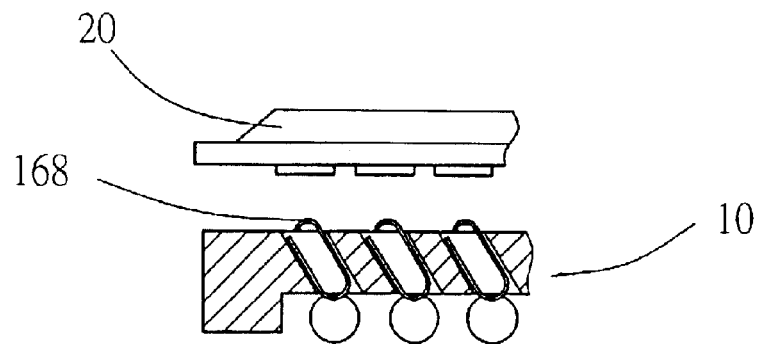
FIG. 5 is an enlarged view of a part of FIG. 3.
Figure 6:
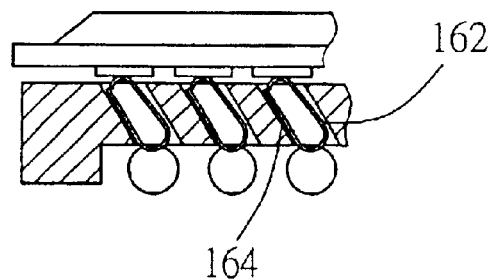
FIG. 6 is an assembly view of FIG. 5.

Referring to FIGS. 3~6, an electric connector 10 is designed for connection a chip module 20 to a circuit board 30, comprising an electrically insulative housing 14 having a set of terminal grooves 12 and a plurality of terminals 16 respectively mounted in the terminal grooves 12 of the housing 14. The terminals 16 are shaped like an oblong open loop, each comprising a smoothly arched base 160, a contact arm 162 and a support arm 164 respectively upwardly extending from the two distal ends of the smoothly arched base 160, and a solder ball (or the like) 166 located on the bottom side of the smoothly arched base 160 for soldering to the circuit board 30. The contact arm 162 has a smoothly arched contact portion 168 protruding over the top side of the corresponding terminal groove 12 for contacting a corresponding contact of the chip module 20. During installation, the chip module 20 is pressed on the contact portions 168 of the terminals 16 to force the contact portion 168 of each terminal 16 against the support arm 164 of the respective terminal 16. therefore the contact arm 162 is compressed on the support arm 164 and maintained in contact with the chip module 20 positively. Because the contact arm 162 is supported on the support arm 164, it will not be excessively deformed. Further, the contact arm 162 and the support arm 164 form a parallel circuit, reducing the impedance of the electric connector 10. The terminal grooves 12 of the housing 14 are arranged in parallel and tilted in one direction. When installed in the terminal grooves 12, the terminals 16 are respectively maintained in a tilting position. This design minimizes the height of the electric connector 10 without reducing the desired arm of force of the terminals 16.

Figure 7:
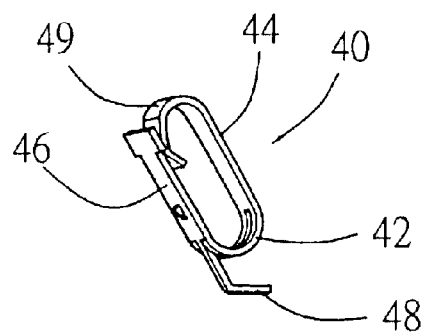
FIG. 7 is an elevational view of a terminal for an electric connector according to the second embodiment of the present invention.
Figure 8:
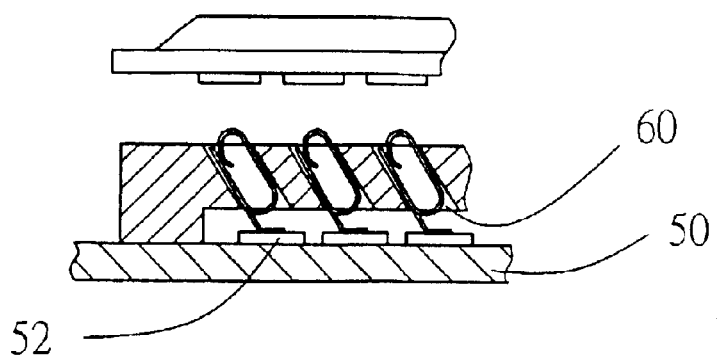
FIG. 8 is an installed view in section of a part of the electric connector according to the second embodiment of the present invention.

FIGS. 7 and 8 show a second embodiment of the present invention. According to this embodiment, the terminal, referenced by 40, is shaped like an oblong open loop, each comprising a smoothly arched base 42, a contact arm 44 and a support arm 46 respectively upwardly extending from the two distal ends of the smoothly arched base 42, and a bonding portion 48 protruded from the bottom side of the smoothly arched base 42 for soldering to the circuit board, referenced by 50. The tail end of the bonding portion 48 extends in horizontal. The contact arm 44 has a top end terminating in a smoothly arched contact portion 49, which is shaped like an invertedly disposed U-turn and supported on the support arm 46. When installed, the support arm 46 supports the smoothly arched contact portion 49 in positive contact with the chip module.

Figure 9:
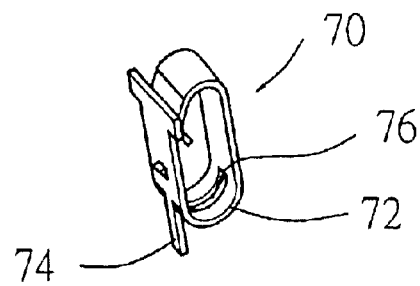
FIG. 9 is an elevational view of a terminal for an electric connector according to the third embodiment of the present invention.
Figure 10:
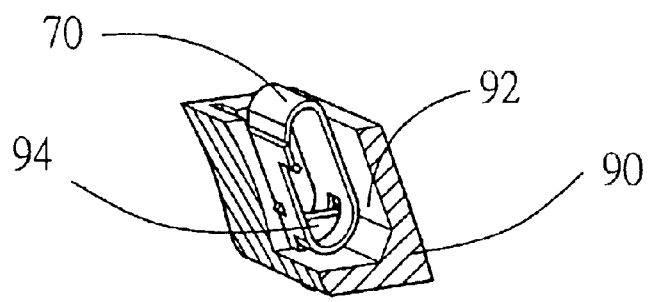
FIG. 10 is a cutaway of a part of the electric connector according to the third embodiment of the present invention, showing the terminal positioned in the corresponding terminal groove of the housing.
Figure 11:
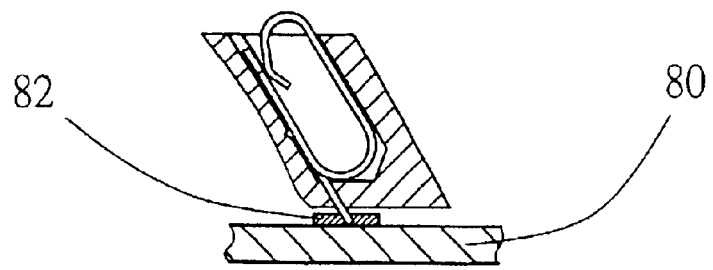
FIG. 11 is a sectional view of a part of the electric connector according to the third embodiment of the present invention, showing the terminal bonded to the circuit board.

FIGS. 9~11 show a third embodiment of the present invention. According to this embodiment, the terminal 70 comprises a punch hole 76 formed in the base 72, and an elongated bonding portion 74 downwardly protruded from one end of the punch hole 76. The bonding portion 74 is formed of a part of the base 72 by stamping. When the bonding portion 74 is formed, the punch hole 76 is produced. The extending direction of the bonding portion 74 is not in parallel to the circuit board 80. During installation, the bonding portion 74 is inserted into the solder pate 82 at the circuit board 80 and fixedly soldered thereto. Further, the housing 90 has a rib 94 disposed in each terminal groove 92. When the terminal 70 inserted into the terminal groove 92, the punch hole 76 is coupled to the rib 94.

Figure 12:
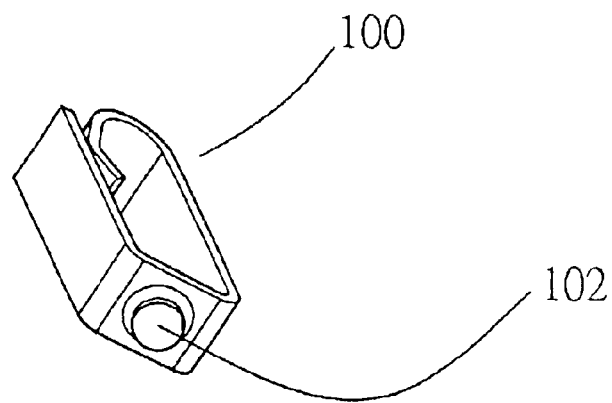
FIG. 12 is an elevational view of a terminal for an electric connector according to the fourth embodiment of the present invention.
Figure 13:
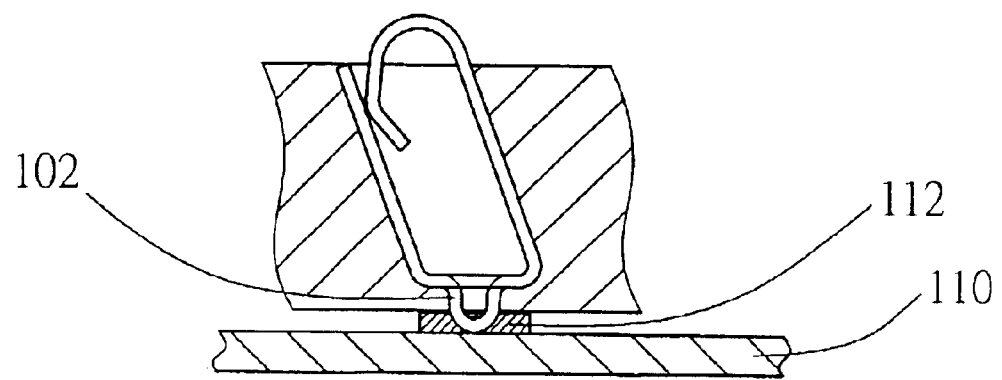
FIG. 13 is a sectional view of a part of the electric connector according to the fourth embodiment of the present invention. showing the terminal bonded to the circuit board.

FIGS. 12 and 13 show a fourth embodiment of the present invention. According to this embodiment, the bonding portion 102 is a hollow cylindrical member downwardly protruded from the bottom side of the base of the terminal 100 and formed by stamping. When installed, the bonding portion 102 is soldered to the solder paste 112 at the circuit board 110.

Figure 14:
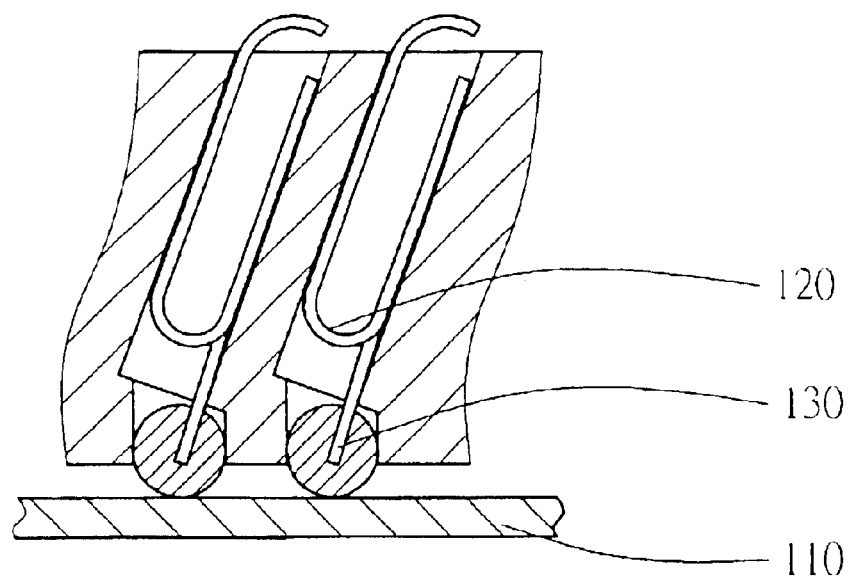
FIG. 14 is a sectional view of a part of an electric connector according to the fifth embodiment of the present invention, showing the solder balls located on the strip-like bonding portions of the terminals and bonded to the circuit board.

FIG. 14 shows a fifth embodiment of the present invention. According to this embodiment, the terminal has at least one strip-like bonding portions 130 downwardly suspended from the base 120 and mounted with a solder ball for bonding to a circuit board 110.

A prototype of electric connector has been constructed with the features of the annexed drawings of FIGS. 3~14. The electric connector functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electric connector comprising an electrically insulative housing, said housing comprising a plurality of terminal grooves obliquely arranged within said housing, and a plurality of terminals respectively mounted in said terminal grooves, wherein said terminals respectively comprising a semicircular base, a support arm upwardly extended from a first end of said semicircular base, and a contact arm upwardly extended from a second end of said semicircular base and protruding above said insulative housing over a top side of the corresponding said terminal groove, said contact arm is partially supported on said support arm, said insulative housing has a rib, and said semicircular base has a hole receiving said rib of said insulative housing.

* * * * *